(12) United States Patent
Funaki et al.

(10) Patent No.: US 6,211,549 B1
(45) Date of Patent: Apr. 3, 2001

(54) HIGH BREAKDOWN VOLTAGE SEMICONDUCTOR DEVICE INCLUDING FIRST AND SECOND SEMICONDUCTOR ELEMENTS

(75) Inventors: Hideyuki Funaki, Tokyo; Akio Nakagawa, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/153,295

(22) Filed: Sep. 15, 1998

(30) Foreign Application Priority Data

Sep. 17, 1997 (JP) .................................................. 9-252350

(51) Int. Cl.[7] ............................ H01L 29/76; H01L 29/94; H01L 31/062; H01L 31/113; H01L 29/00
(52) U.S. Cl. ........................ 257/329; 257/501; 257/502; 257/330; 257/331; 257/337
(58) Field of Search .................................. 257/341, 337, 257/500, 501, 502, 329, 330, 331, 333

(56) References Cited

U.S. PATENT DOCUMENTS 5,801,417 * 9/1998 Tsang et al. ........................ 257/333

OTHER PUBLICATIONS

Gary M. Dolny, et al., "Silicon–on–Insulator Approach for Power IC's Integrating Vertical DMOS and Polycrystalline–Silicon CMOS Thin–Film Transistors," IEEE Electron Device Letters, vol. 13, No. 10, (Oct. 1992), pp. 516–518.

* cited by examiner

Primary Examiner—Steven Loke
(74) Attorney, Agent, or Firm—Oblon, Spivak, McClelland, Maier & Neustadt, P.C (57) ABSTRACT

A semiconductor device includes a first semiconductor element and a second semiconductor element, wherein the first semiconductor element of trench structure and the control circuit including the second semiconductor element such as a TFT or a bipolar transistor can be easily integrated by making the device structure such that the source layer of the buried gate electrode of the first semiconductor element and part of the second semiconductor element, such as the emitter or collector region, can be simultaneously formed.

6 Claims, 12 Drawing Sheets

HIGH BREAKDOWN VOLTAGE SEMICONDUCTOR DEVICE INCLUDING FIRST AND SECOND SEMICONDUCTOR ELEMENTS

BACKGROUND OF THE INVENTION

1. Field of the Invention

This invention relates to a high breakdown voltage semiconductor device in which a first semiconductor element with high breakdown voltage and a second semiconductor element acting as the control circuit thereof are integrally formed and more particularly to a high breakdown voltage semiconductor device in which the first semiconductor element with high breakdown voltage is formed of insulated gate bipolar transistors (IGBTs) having trench structures or the like and the control circuit is formed of a field effect transistor, bipolar transistor or the like formed of polycrystalline semiconductor.

2. Discussion of the Background

In the field of power electronics, an IGBT having a high speed switching characteristic and high power characteristic is widely used as an excellent power switching element. At the time of operation of this type of switching element, a control circuit such as a gate driver circuit or overcurrent protection circuit is simultaneously used.

Therefore, it is expected that the cost can be greatly reduced and the area of the device can be reduced by integrally and simultaneously forming the control circuit and the IGBTs.

Specifically, it is possible to form a thin film transistor (TFT) of polysilicon as the control circuit on the pads of the IGBTs with an insulating film disposed therebetween.

Figure 1:
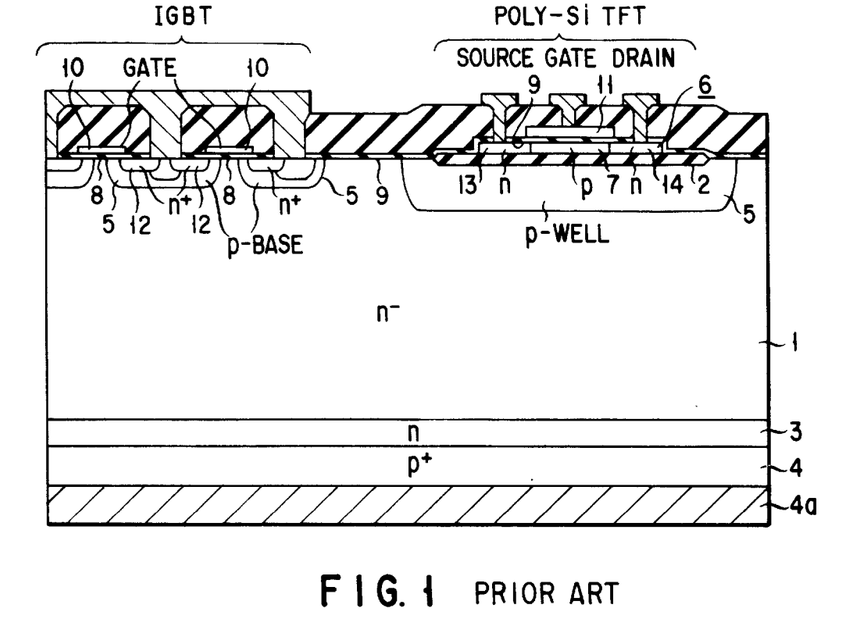
FIG. 1 is a cross sectional view showing the structure of a high breakdown voltage semiconductor device in which a conventional vertical IGBT and a control circuit are integrated.

FIG. 1 is a cross sectional view showing the structure of a high breakdown voltage semiconductor device in which vertical IGBTs and a control circuit are integrated. In the high breakdown voltage semiconductor device, p-type impurity is selectively ion-implanted from the surface to form p-type base regions (wells) 5 by use of a resist mask. Then, a field oxide film 2 is formed by oxidation to a thickness of approximately 500 nm to 1 μm on the surface of an n⁻-type substrate 1 formed of single crystal silicon. On the rear surface of the n⁻-type substrate 1, an n-type buffer layer 3 and p⁺-type drain layer 4 are formed by diffusion. Then, a drain electrode 4a is formed on the rear surface of p⁺-type drain layer 4.

After this, amorphous silicon is deposited on the field oxide film 2 and then the amorphous silicon is annealed to grow as a polysilicon layer 6 in a solid phase. Then, a p-type active layer 7 is formed in the polysilicon layer by ion-implantation for a channel layer. After this, gate oxide films 8, 9 and gate electrodes 10, 11 of the vertical IGBT and TFT are simultaneously formed.

Then, n⁺-type source layers 12 of the vertical IGBT and an n⁺-type source region 13 and n⁺-type drain region 14 of the TFT are simultaneously formed in a self-alignment manner by ion-implantation using the gate electrodes 10 and 11 each as a mask. Electrodes are connected to the respective areas to complete an integrated structure of the vertical IGBTs and the control circuit.

Recently, as the IGBT, a trench structure is used instead of the planer structure described above in order to enhance the current density.

However, in order to form an IGBT of trench structure, it is required to form an n⁺-type source layer on the surface of the p-type base layer, then form a trench and bury a gate electrode in the trench. On the other hand, in the TFT, a gate electrode is formed and source and drain regions are formed in a self-alignment manner with the gate electrode used as a mask. Thus, in the TFT and IGBT of the trench structure, the order in which the gate electrode and the source region are formed is reversed, it is difficult to simultaneously form them, and it is not preferable to integrally form them.

BRIEF SUMMARY OF THE INVENTION

An object of this invention is to provide a high breakdown voltage semiconductor device in which a first semiconductor element including, for example, IGBTs of trench structure and a second semiconductor element including a TFT or bipolar transistor acting as a control circuit thereof are easily integrated.

The main feature of this invention lies in that the IGBT of trench structure and the control circuit including a TFT or bipolar transistor can be integrated by forming the device structure such that the source layer of the first conductivity type or the buried gate electrode of the first semiconductor element of trench structure and part of the second semiconductor element can be simultaneously formed.

In order to attain the above object, a semiconductor device of a first aspect of this invention comprises a first semiconductor element and a second semiconductor element, wherein the first semiconductor element includes a base layer of a first conductivity type with high resistance having a first and a second main surface; a base layer of a second conductivity type formed on the first main surface of the base layer of the first conductivity type; a source layer of the first conductivity type formed in a surface area of the base layer of the second conductivity type; a drain layer of anyone of the first and the second conductivity type formed on anyone of the first and the second main surface of the base layer of the first conductivity type; a gate electrode buried and formed in a trench which penetrates the source layer of the first conductivity type and the base layer of the second conductivity type with a first insulating film disposed therebetween; a source electrode formed in contact with the source layer of the first conductivity type and the base layer of the second conductivity type; and a drain electrode formed in contact with the drain layer, and the lateral semiconductor element includes a gate layer of the first conductivity type formed in another surface area of the base layer of the second conductivity type; a base region of the second conductivity type formed on the gate layer of the first conductivity type with a second insulating film disposed therebetween; and a source and a drain region of the first conductivity type insulatively formed on the first main surface to hold the base region of the second conductivity type therebetween.

The source layer of the first conductivity type can be formed to have the same depth as the gate layer of the first conductivity type.

The gate electrode includes a first gate electrode formed in and along the trench with the gate insulating film disposed therebetween and a second gate electrode formed on the first gate electrode with a third insulating film disposed therebetween to fill the trench, and the first gate electrode may have the same impurity concentration as the source region of the first conductivity type.

The second gate electrode may have substantially the same impurity concentration as the drain region of the first conductivity type.

A high breakdown voltage semiconductor device according to a second aspect of this invention comprises a first semiconductor element and a second semiconductor element, wherein the first semiconductor element includes a base layer of a first conductivity type with high resistance having a first and a second main surface; a base layer of a second conductivity type formed on the first main surface of the base layer of the first conductivity type; a source layer of the first conductivity type formed in a surface area of the base layer of the second conductivity type; a drain layer of anyone of the first and the second conductivity type formed on anyone of the first and the second main surface of the base layer of the first conductivity type; a gate electrode buried and formed in a trench which penetrates the source layer of the first conductivity type and the base layer of the second conductivity type with a first insulating film disposed therebetween; a source electrode formed in contact with the source layer of the first conductivity type and the base layer of the second conductivity type; and a drain electrode formed in contact with the drain layer; and the second semiconductor element includes a base region of the second conductivity type insulatively formed on a surface of the base layer of the second conductivity type; a gate layer formed on the base region of the second conductivity type with a second insulating film disposed therebetween; and a source and a drain region of the first conductivity type insulatively formed on the surface of the base layer to hold the base region of the second conductivity type therebetween.

The source layer of the first conductivity type can be formed to have the same thickness as the source region of the first conductivity type, the drain region of the first conductivity type, and the base region of the second conductivity type.

The gate electrode includes a first gate electrode formed in and along the trench with the gate insulating film disposed therebetween and a second gate electrode formed on the first gate electrode with a third insulating film disposed therebetween to fill the trench, the first gate electrode may have substantially the same impurity concentration as the gate layer.

A high breakdown voltage semiconductor device according to a third aspect of this invention comprises a first semiconductor element and a second semiconductor element, wherein the first semiconductor element includes a base layer of a first conductivity type with high resistance having a first and a second main surface; a base layer of a second conductivity type formed on the first main surface of the base layer of the first conductivity type; a source layer of the first conductivity type formed in a surface area of the base layer of the second conductivity type; a drain layer of anyone of the first and the second conductivity type formed on anyone of the first and the second main surface of the base layer of the first conductivity type; a gate electrode buried and formed in a trench which penetrates the source layer of the first conductivity type and the base layer of the second conductivity type with a gate insulating film disposed therebetween; a source electrode formed in contact with the source layer of the first conductivity type and the base layer of the second conductivity type; and a drain electrode formed in contact with the drain layer; and the second semiconductor element includes one of an emitter region and a collector region of the first conductivity type formed in a surface area of the base layer of the second conductivity type; a base region of the second conductivity type formed on the one of the emitter region and the collector region of the first conductivity type; the other of the emitter region and the collector region of the first conductivity type formed on the base layer of the second conductivity type.

The source layer of the first conductivity type can be formed to have the same depth as the one of the emitter region and the collector region of the first conductivity type.

The gate electrode includes a first gate electrode formed in and along the trench with the gate insulating film disposed therebetween and a second gate electrode formed on the first gate electrode with another insulating film disposed therebetween to fill the trench, and the first gate electrode may have the same impurity concentration as the other of the emitter region and the collector region.

A high breakdown voltage semiconductor device according to a fourth aspect of this invention comprises a first semiconductor element and a second semiconductor element, wherein the first semiconductor element includes a base layer of a first conductivity type with high resistance having a first and a second main surface; a base layer of a second conductivity type formed on the first main surface of the base layer of the first conductivity type; a source layer of the first conductivity type formed in a surface area of the base layer of the second conductivity type; a drain layer of anyone of the first and the second conductivity type formed on anyone of the first and the second main surface of the base layer of the first conductivity type; a gate electrode buried and formed in a trench which penetrates the source layer of the first conductivity type and the base layer of the second conductivity type with a gate insulating film disposed therebetween; a source electrode formed in contact with the source layer of the first conductivity type and the base layer of the second conductivity type; and a drain electrode formed in contact with the drain layer; and the second semiconductor element includes an active layer insulatively formed on the surface of the base layer of the second conductivity type; one of an emitter region and a collector region of the first conductivity type formed in the active layer; a base region of the second conductivity type formed adjacent to the one of the emitter region and the collector region of the first conductivity type in the active layer; the other of the emitter region and the collector region of the first conductivity type formed on the base region of the second conductivity type.

The source layer of the first conductivity type can be formed to have the same thickness as the active layer.

The gate electrode includes a first gate electrode formed in and along the trench with the gate insulating film disposed therebetween and a second gate electrode formed on the first gate electrode with another insulating film disposed therebetween to fill the trench, and the second gate electrode may have the same impurity concentration as the other of the emitter region and the collector region.

In the first to fourth aspects of this invention, it is preferable to form a buffer layer of the first conductivity type between the base layer of the first conductivity type and the drain layer.

This invention can be formed with the structure described above, and since the buried gate electrode and source layer of the first conductivity type of the first semiconductor element and part of the second semiconductor element can be simultaneously formed, the first semiconductor element such as an IGBT or an MOSFET of trench structure and the second semiconductor element such as a TFT and bipolar transistor which constructs the control circuit therefor can be integrally and simultaneously formed, and as a result, a high breakdown voltage semiconductor device with high performance can be formed at the low cost.

Further, if a buffer layer of the first conductivity type is formed between the base layer of the first conductivity type and the drain layer of the second conductivity type, the breakdown voltage in a forward direction blocking state can be further enhanced.

When the second semiconductor element is formed by use of polycrystalline semiconductor, this invention is realized at the lower cost.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention in which.

DETAILED DESCRIPTION OF THE INVENTION

There will now be described embodiments of this invention with reference to the accompanying drawings.
(First Embodiment)

Figure 2:
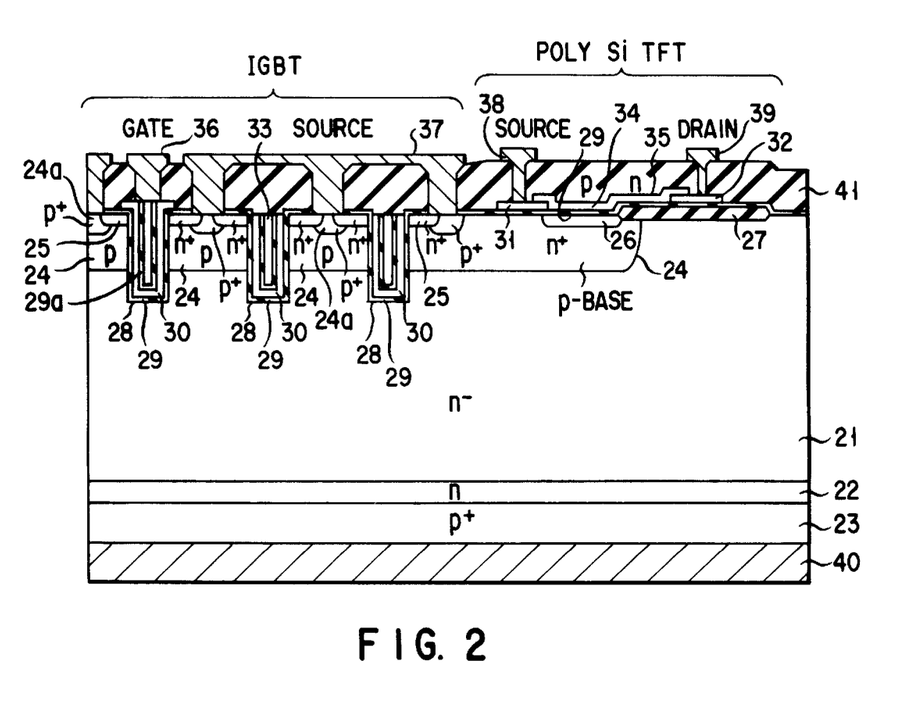
FIG. 2 is a cross sectional view showing the structure of a high breakdown voltage semiconductor device according to a first embodiment of this invention.

FIG. 2 is a cross sectional view showing the structure of a high breakdown voltage semiconductor device of a first embodiment of this invention. The high breakdown voltage semiconductor device has a $p^+$-type drain layer 23 formed on one of the surfaces of an $n^-$-type active layer (base layer) 21 having an impurity concentration of approximately $1 \times 10^{14}$ $cm^{-3}$ with an n-type buffer layer 22 disposed therebetween. A p-type base layer 24 is selectively formed on the other surface of the $n^-$-type active layer 21. On the surface of the p-type base layer 24, $p^+$-type contact layers 24a, $n^+$-type source layers 25 and $n^+$-type gate layer 26 are selectively formed. On the surface region which ranges from a portion in contact with one end portion of the $n^+$-type gate layer 26, passing along the p-type base layer 24, to the $n^-$-type active layer 21, a LOCOS oxide film 27 is selectively formed.

In the $n^+$-type source layers 25, a plurality of trenches 28 which penetrate the $n^+$-type source layers 25 and the p-type base layer 24 and have depths extending into the $n^-$-type active layer 21 are selectively formed. Each trench 28 includes a first outside trench and a second trench formed in a polysilicon layer insulatively filled in the first trench and the bottom portion of the first trench is formed substantially in parallel with the surface of the $p^+$-type drain layer 23.

Gate oxide films 29 are formed in the trenches 28 lying in an IGBT region, on the p-type base layer 24, $n^+$-type gate layer 26 and LOCOS oxide film 27 lying in a TFT region. Further, gate electrodes 30 of the IGBT, and a source region 31 and drain region 32 of the TFT are formed of first polysilicon on the gate oxide films 29 in the respective trenches 28 lying in the IGBT region, and on the oxide film 29 on the other end portion of the $n^+$-type gate layer 26 and on the LOCOS oxide film 27 lying in the TFT region, respectively.

Gate electrodes 33 of the IGBT and a p-type base region 34 and n-type active layer 35 of the TFT are formed of second polysilicon on the gate electrodes 30 in the trenches 28 of the IGBT and on the oxide film 29 between the source and drain regions 31 and 32 of the TFT. Insulating films 29a which have been formed before formation of the gate electrodes 33 lie between the gate electrodes 30 and 33.

In the IGBT region, a gate interconnection layer 36 of Al formed in contact with the gate electrodes 30 and 33, and a source electrode 37 of Al formed in contact with $p^+$-type contact layers 24a and $n^+$-type source layers 25 are formed with an inter-level insulating film 41 disposed therebetween. The $p^+$-type contact layer 24a has the same conductivity type as the p-type base layer 24 and is contained in the p-type base layer 24 in a wide sense.

In the TFT region, a source electrode 38 of Al formed in contact with the source region 31 and a drain electrode 39 of Al formed in contact with the drain region 32 are formed with the inter-level insulating film 41 disposed therebetween. Further, a drain electrode 40 (Al) of the IGBT is formed on the $p^+$-type drain layer 23 on the rear surface of the substrate.

Next, the manufacturing method and the operation of the high breakdown voltage semiconductor device described above are explained.

The n-type buffer layer 22 and $p^+$-type drain layer 23 are sequentially formed by diffusion on the rear surface of the $n^-$-type active layer 21. Alternatively, an $n^+$-type buffer layer and $n^-$-type active layer may be formed by epitaxial growth on a $p^+$-type substrate of low resistance.

Figure 3A:
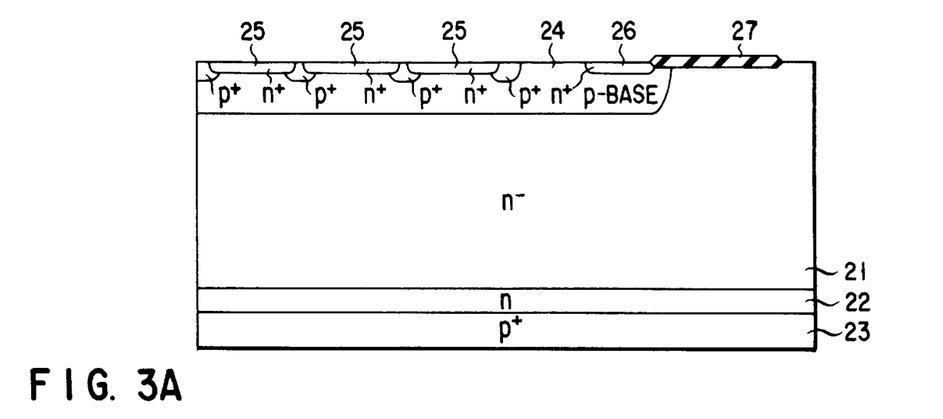
FIGS. 3A to 3C are cross sectional views sequentially showing the steps of a manufacturing method of the first embodiment.

Further, after boron is ion-implanted into the surface of the n⁻-type active layer 21, a LOCOS oxide film 27 is formed by local oxidation at the same time as formation of the p-type base layer 24 by well diffusion as shown in FIG. 3A and arsenic is ion-implanted and diffused to form n⁺-type source layers 25 of the IGBT and an n⁺-type gate layer 26 acting as the back gate of the TFT.

Figure 3B:
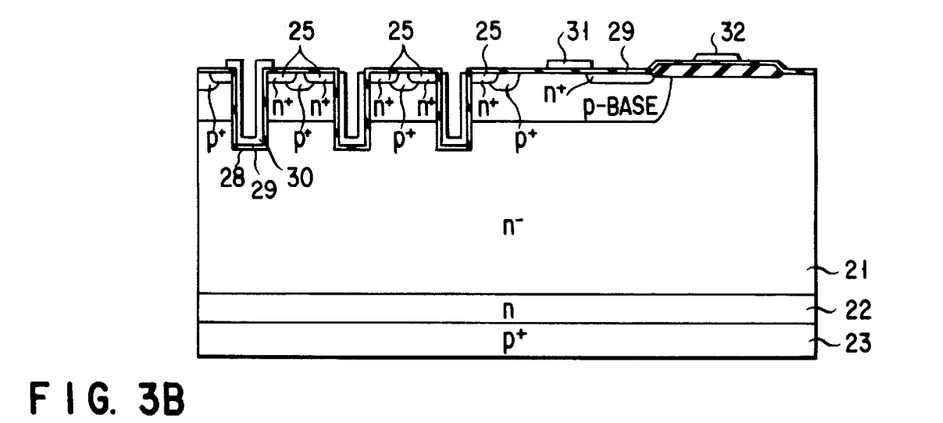

Next, as shown in FIG. 3B, trenches 28 are selectively formed in the n⁺-type source layers 25 and then oxide films 29 are formed by gate oxidation and a polysilicon layer is deposited. The polysilicon layer is used as the buried gate layers 30 of the IGBT and the source region 31 and drain region 32 of the TFT.

Figure 3C:
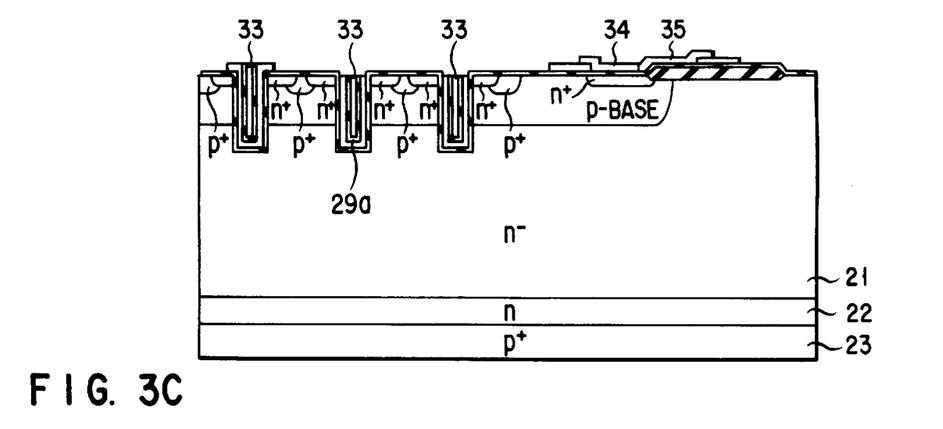

After this, as shown in FIG. 3C, an insulating film 29a is formed in each of the trenches 28 with the polysilicon layer 30 disposed therebetween. Then, amorphous silicon is deposited in the trenches 28 and on regions acting as the active layer of the TFT and converted into polysilicon by solid phase growth by annealing. Further, impurity for channel formation is ion-implanted to form gate electrodes 33 in the trenches 28 and active layers 34 and 35 of the TFT.

It is noted that the insulating film 29a is electrically connected to the gate oxide film 29 above the p-type base layer 24, though not shown in the figures.

By ion-implantation of boron, the p-type base region 34 is formed. Then, the inter-level insulating film 41 is deposited, contact holes are formed in the inter-level insulating film 41, aluminum used for forming the electrodes 36 to 40 is sputtered and etched to complete the device shown in FIG. 2.

As described above, according to this embodiment, by forming the back-gate structure in which the n⁺-type gate layer 26 of the TFT lies below the source and drain regions 31 and 32, for example, the IGBT of the trench structure and the lateral TFT can be integrally formed while commonly effecting some of the steps.

That is, in the above structure, the n⁺-type source layers 25 and the buried gate electrodes 30 and 33 of the vertical IGBT and part (26, 31, 32, 34, 35) of the lateral TFT can be simultaneously formed, and therefore, the vertical trench IGBT and the control circuit therefor can be simultaneously formed, thereby making it possible to lower the cost of the device.

Figure 4:
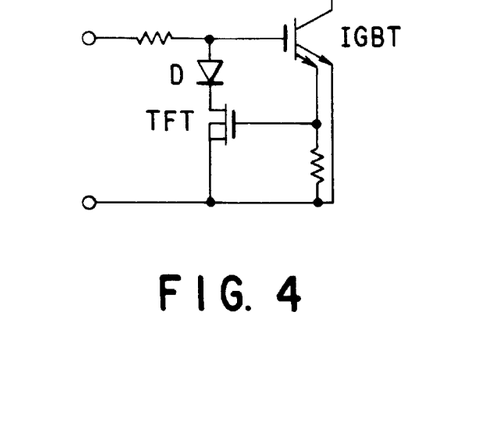
FIG. 4 is a circuit diagram showing an application example of the high breakdown voltage semiconductor device of the first embodiment.

For example, as shown in FIG. 4, the TFT is suitably used as an overcurrent protection circuit which is turned ON when detecting the overcurrent of the IGBT and effecting the operation of lowering the gate voltage of the IGBT. A diode D in FIG. 4 may be attached from the exterior or integrally formed with the device of this embodiment.

(Second Embodiment)

Figure 5:
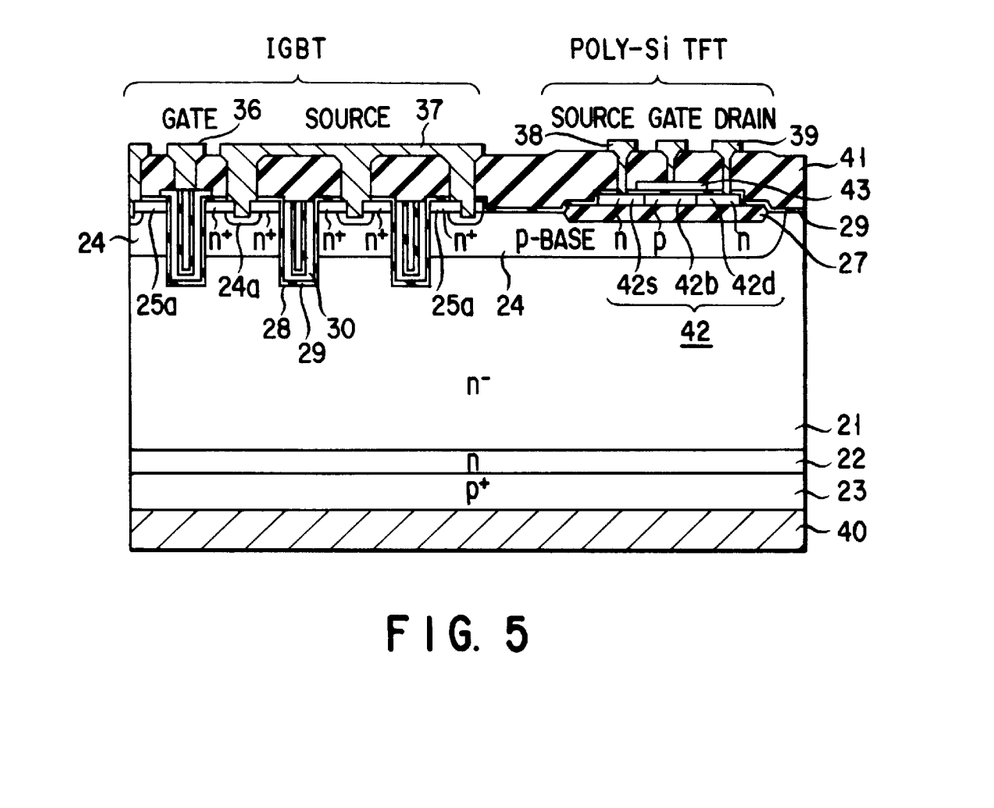
FIG. 5 is a cross sectional view showing the structure of a high breakdown voltage semiconductor device according to a second embodiment of this invention.

FIG. 5 is a cross sectional view showing the structure of a high breakdown voltage semiconductor device according to a second embodiment of this invention, portions which are the same as those of FIG. 2 are denoted by the same reference numerals, the explanation therefor is omitted and only the different portion is explained here. This applies to the other embodiments and the repetitive explanation is omitted.

That is, this embodiment is a modification of the first embodiment, and n⁺-type source layers 25a formed of polysilicon are selectively formed on the surface of a p-type base layer 24 in the IGBT region, and at the same time, an active region 42 having a p-type base channel region 42b held between an n-type source region 42s and an n-type drain region 42d is formed on a LOCOS oxide film 27 in the TFT region. On the active region 42, a gate electrode 43 of polysilicon is selectively formed on the active region 42 with a gate insulating film 29 disposed therebetween.

Figure 6A:
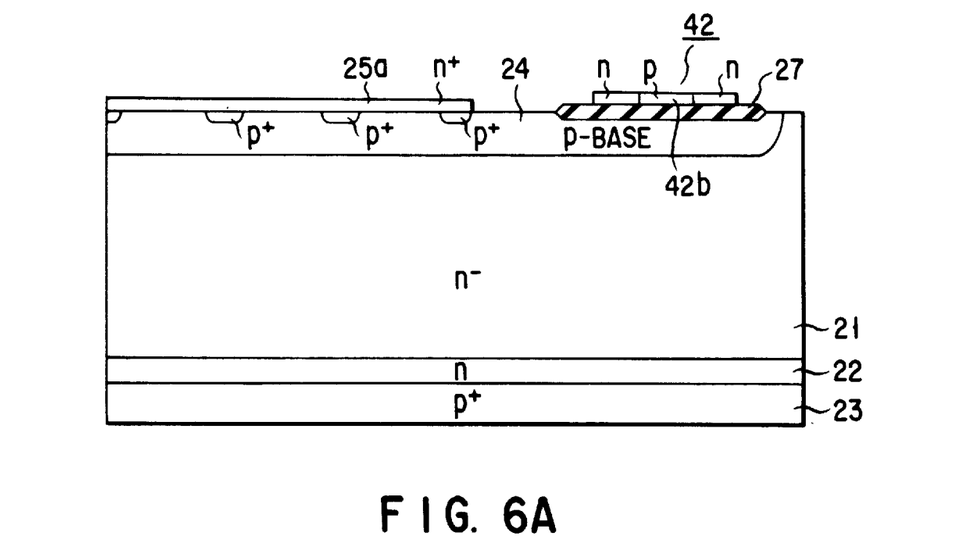
FIGS. 6A and 6B are cross sectional views sequentially showing the steps of a manufacturing method in the second embodiment.

With the above structure, after formation of the p-type base layer 24 by diffusion, the n⁺-type source layers 25a of the IGBT region and the active region 42 of the TFT region are formed by deposition of amorphous silicon as shown in FIG. 6A. After formation of the active region 42, the p-type base region 42b of the TFT is formed by ion-implantation of boron.

Figure 6B:
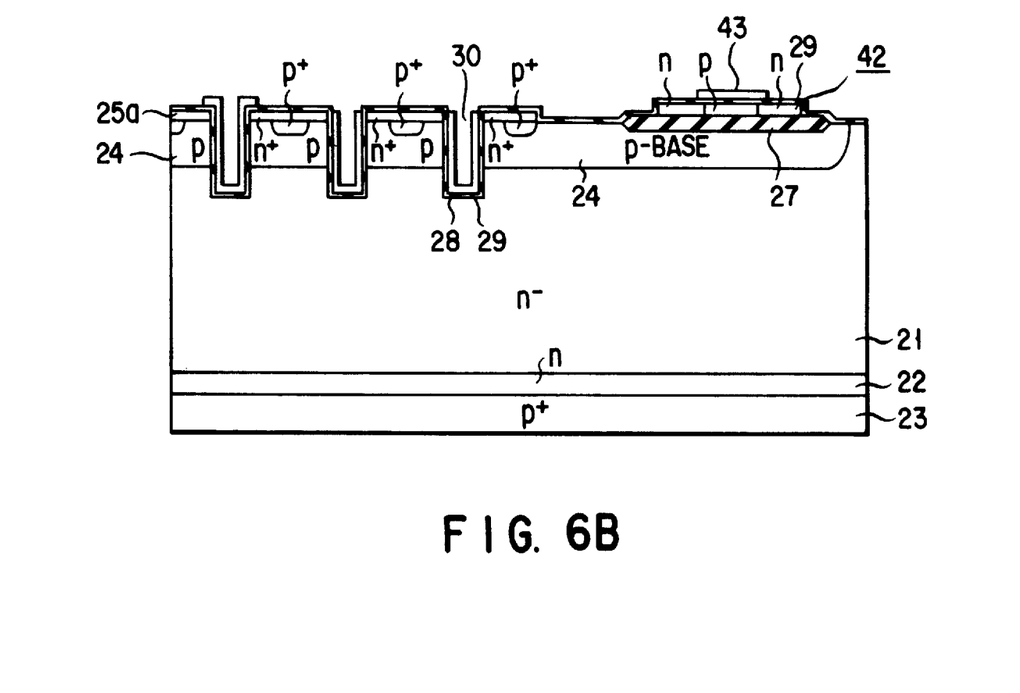

Then, as shown in FIG. 6B, after trenches 28 are formed and oxide films 29 are formed by gate oxidation, gate electrodes 30 and 43 of the IGBT and TFT are formed by deposition of polysilicon. After this, like the first embodiment, electrodes are formed to complete the device of FIG. 5.

In the second embodiment, the same effect as in the first embodiment can be attained. Polysilicon germanium may be used instead of polysilicon for formation of the n⁺-type source layers 25a of the IGBT.

(Third Embodiment)

Figure 7:
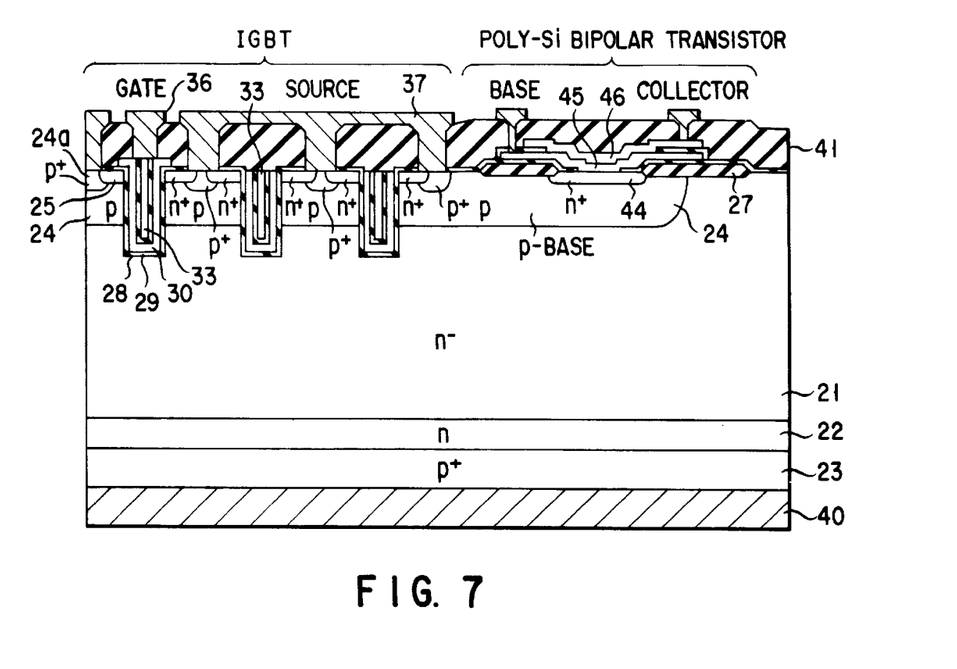
FIG. 7 is a cross sectional view showing the structure of a high breakdown voltage semiconductor device according to a third embodiment of this invention.

FIG. 7 is a cross sectional view showing the structure of a high breakdown voltage semiconductor device according to a third embodiment of this invention. This embodiment is a modification of the first embodiment, and an n⁺-type emitter layer 44 is selectively formed on the surface of a p-type base layer 24, instead of the n⁺-type gate layer 26 in a bipolar transistor region, corresponding to the TFT region. A p-type base region 45 and n-type collector region 46 are sequentially formed on the n⁺-type emitter region 44.

Figure 8A:
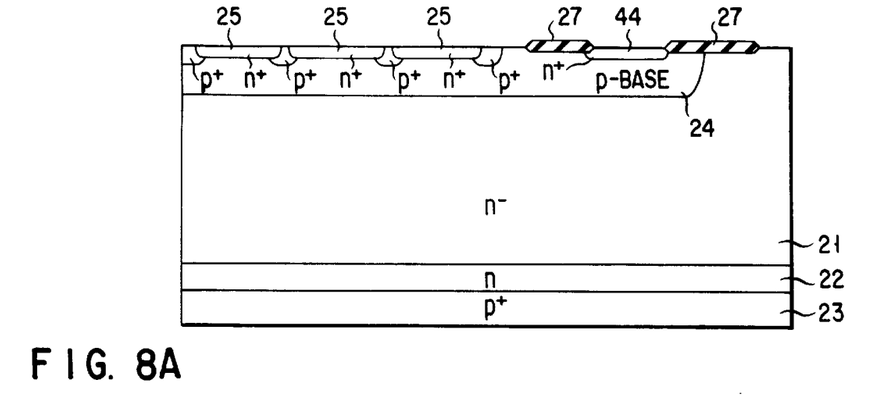
FIGS. 8A to 8C are cross sectional views sequentially showing the steps of a manufacturing method in the third embodiment.
Figure 8B:
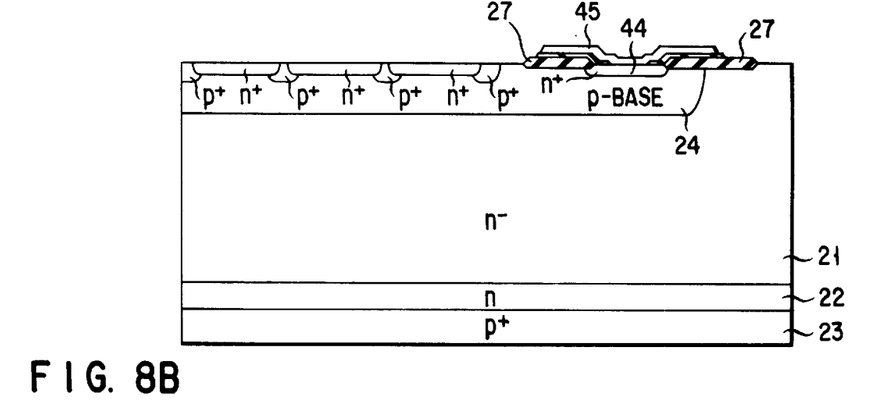
Figure 8C:
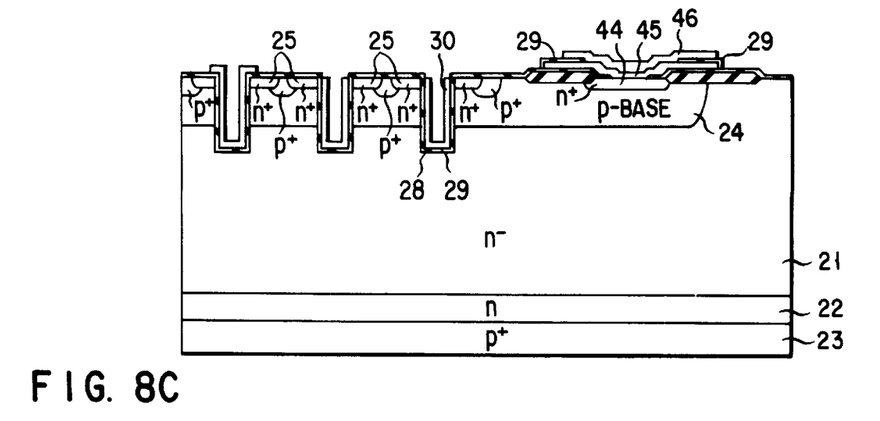

With the above structure, after formation of the p-type base layer 24 by diffusion, arsenic is ion-implanted to form n⁺-type source regions 25 of the IGBT and an n⁺-type emitter layer 44 of the lateral bipolar transistor as shown in FIG. 8A. As shown in FIG. 8B, an active region of the TFT is formed by deposition of amorphous silicon, and at the same time, a p-type base region 45 of the bipolar transistor is formed. As shown in FIG. 8C, after trenches 28 are formed and gate oxide films are formed therein, part of an oxide film 29 on the p-type base region 45 is removed, polysilicon is deposited to form an n⁺-type collector region 46 of the bipolar transistor. After this, electrodes are formed in the same manner as described before to complete the device shown in FIG. 7.

Also, in this embodiment, the same effect as in the first embodiment can be attained. Polysilicon germanium may be deposited instead of polysilicon for formation of the n⁺-type collector layer 46. In this case, a hetero junction is formed to enhance the operation speed of the bipolar transistor.

Further, the bipolar transistor may be constructed such that the n⁺-type layer 44 is used for an emitter and the n⁺-type region 46 is used for a collector.

(Fourth Embodiment)

Figure 9:
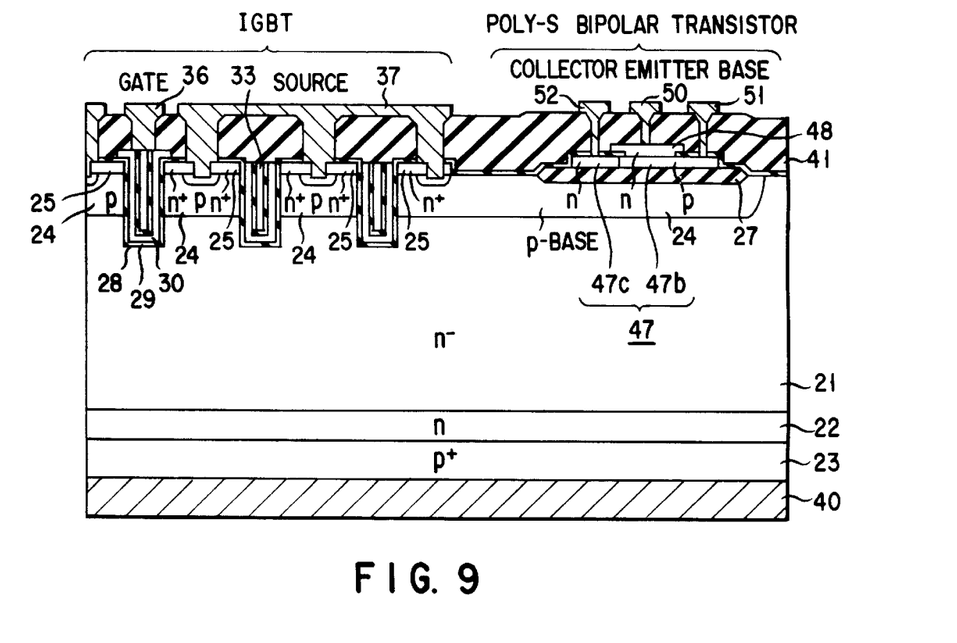
FIG. 9 is a cross sectional view showing the structure of a high breakdown voltage semiconductor device according to a fourth embodiment of this invention.

FIG. 9 is a cross sectional view showing the structure of a high breakdown voltage semiconductor device according to a fourth embodiment of this invention. This embodiment is a modification of the first embodiment, and n⁺-type source layers 25a of polysilicon are selectively formed on the surface of a p-type base layer 24 in the IGBT region and an active region 47 formed of an n-type collector region 47c and p-type base region 47b is formed on a LOCOS oxide film 27 in a bipolar transistor region corresponding to the TFT region. An n⁺-type emitter region 48 of polysilicon is selectively formed on part of the p-type base region 47b which lies near the n-type collector region 47c and an emitter electrode 50 is formed on the n-type emitter region 48. Further, a base electrode 51 is formed on the end portion of the p-type base region 47b which is far apart from the n-type collector region 47c. A collector electrode 52 is formed on the n-type collector region 47c.

Figure 10A:
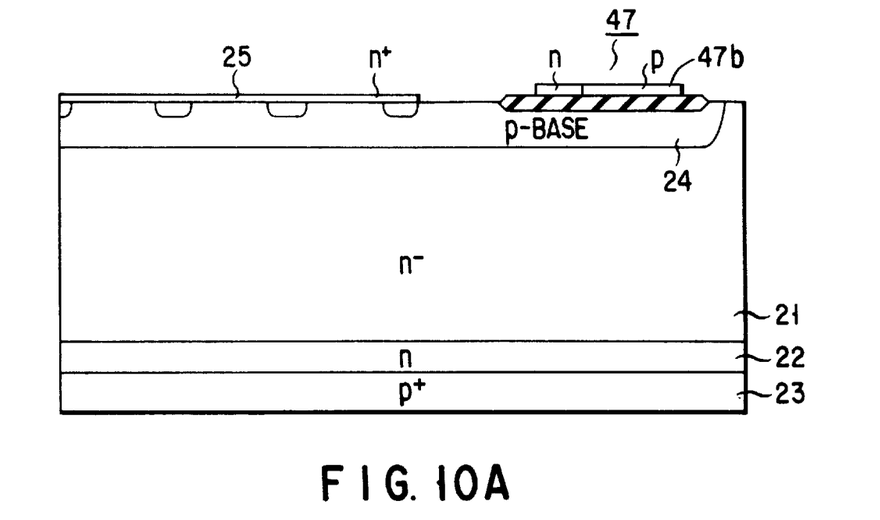
FIGS. 10A and 10B are cross sectional views sequentially showing the steps of a manufacturing method in the fourth embodiment.
Figure 10B:
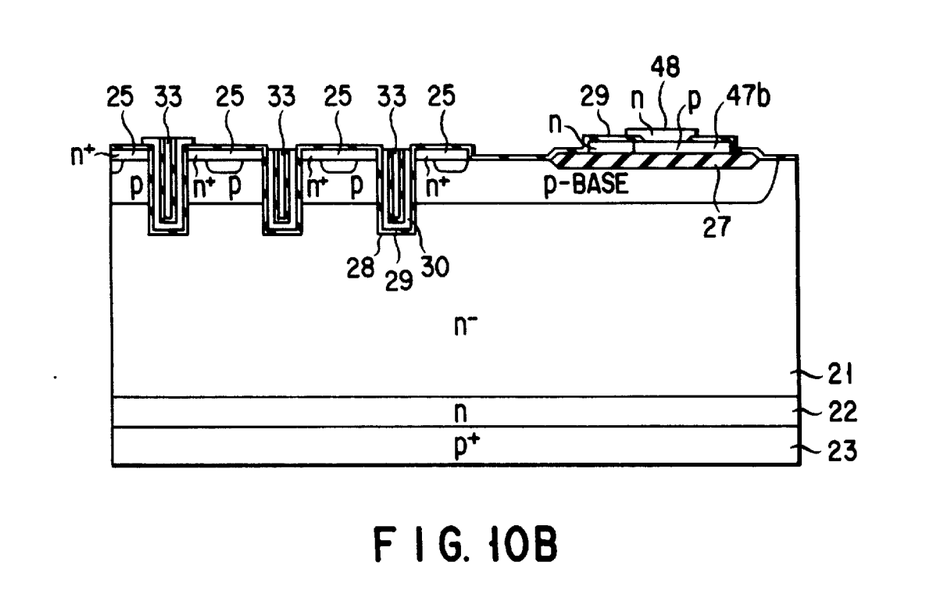

With the above structure, after formation of the p-type base layer 24 by diffusion, amorphous silicon or polysilicon is deposited to form the n$^+$-type source regions 25a of the IGBT and the active region 47 of the lateral bipolar transistor as shown in FIG. 10A. Next, the p-type base region 47b of the lateral bipolar transistor is formed. As shown in FIG. 10B, after trenches 28 are formed and gate oxide films are formed therein, gate electrodes 30 of the IGBT are formed by deposition of polysilicon. After oxidation of polysilicon, part of an oxide film 29 on the p-type base layer 47b is removed. After this, polysilicon is deposited to form an n$^+$-type emitter region 48 of the bipolar transistor on the p-type base layer 47b.

Also, with the structure of the fourth embodiment, the same effect as in the first embodiment can be attained. Polysilicon germanium may be deposited instead of polysilicon for formation of the n$^+$-type source layers 25. In this case, a hetero junction is formed in the emitter/base interface of the bipolar transistor to enhance the operation speed of the bipolar transistor as in the third embodiment.

Further, the bipolar transistor may be constructed such that the n-type region 47c is used for an emitter and the n-type region 48 is used for a collector.

(Fifth Embodiment)

Figure 11:
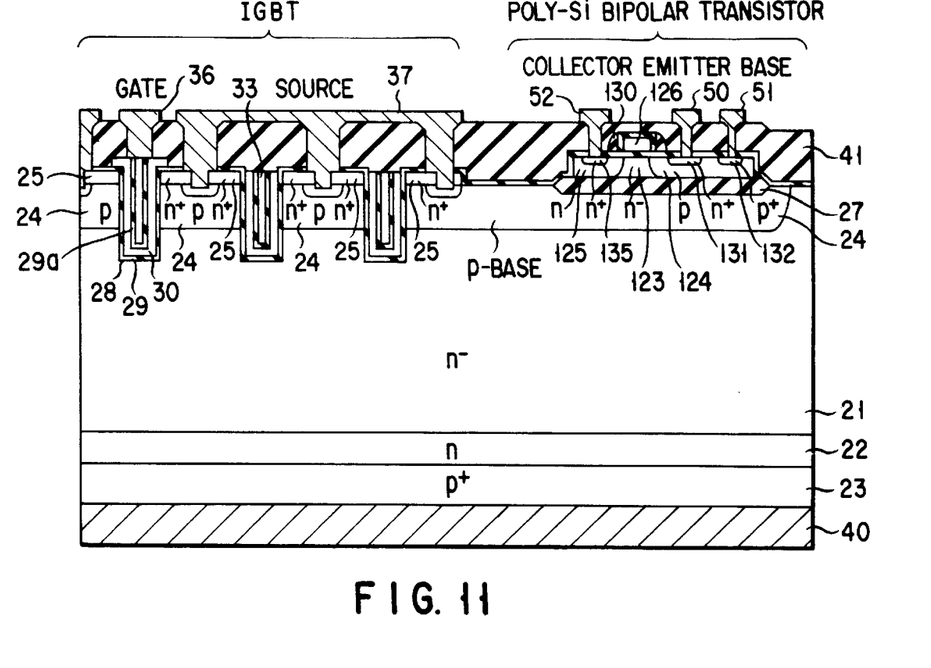
FIG. 11 is a cross sectional view showing the structure of a high breakdown voltage semiconductor device according to a fifth embodiment of this invention.

FIG. 11 is a cross sectional view showing the structure of a high breakdown voltage semiconductor device according to a fifth embodiment of this invention. This embodiment is a modification of the first embodiment, and n$^+$-type source layers 25 of polysilicon are selectively formed on the surface of a p-type base layer 24 in an IGBT region, p-type base region 124 and n-type collector regions 125 and 123 of polysilicon are formed on a LOCOS oxide film 27 in a bipolar transistor region corresponding to the TFT region and an n-type emitter region 131 is selectively formed on the surface of the p-type base region 124. An emitter electrode 50 is formed on an n-type emitter region 48. Further, on the n-type collector region 125, a collector electrode 52 is formed via an n$^+$-type contact region 135. On the p-type base region 124, a base electrode 51 is formed via a p$^+$-type contact region 132.

Figure 12A:
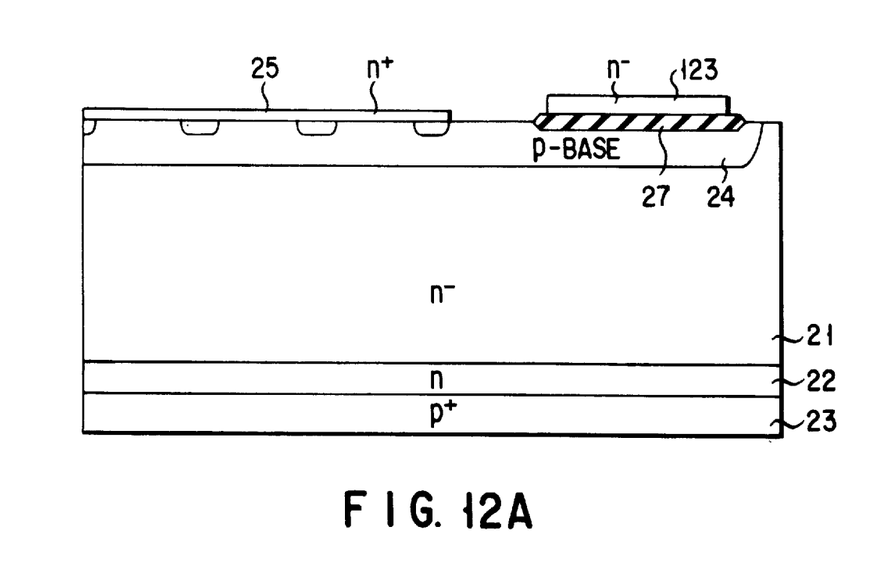
FIGS. 12A to 12D are cross sectional views sequentially showing the steps of a manufacturing method in the fifth embodiment.

With the above structure, after formation of the p-type base layer 24 by diffusion, amorphous silicon or polysilicon is deposited to form the n$^+$-type source regions 25a of the IGBT and the active region 123 of the lateral bipolar transistor as shown in FIG. 12A.

Figure 12B:
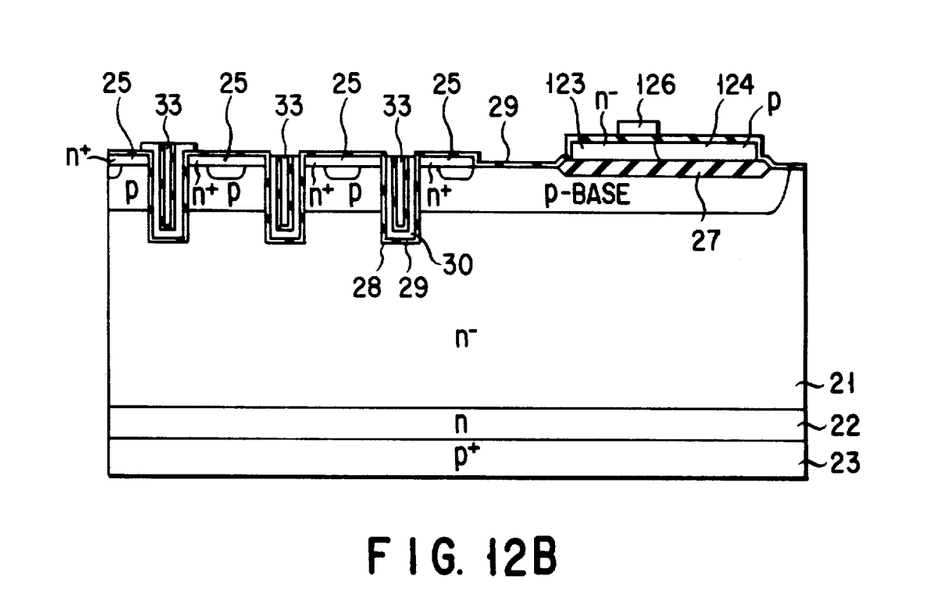

Next, an oxide film 29 is formed by oxidation of polysilicon as shown in FIG. 12B and a first spacer 126 of polysilicon is formed on the lateral bipolar transistor region. Then, a resist (not shown) is formed to cover the left portion of the first spacer 126 and boron or the like is ion-implanted to form the p-type base layer 124.

Figure 12C:
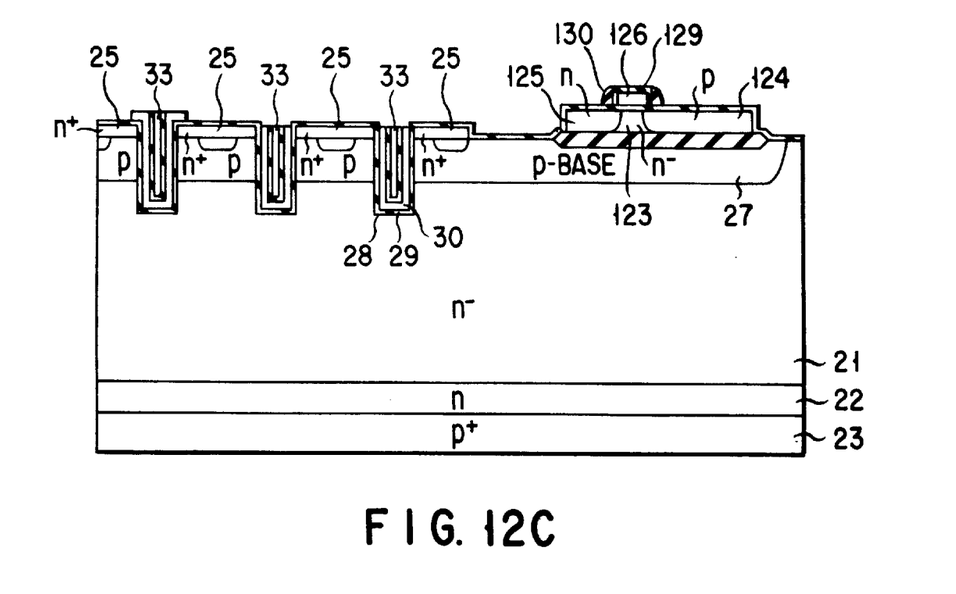

After this, as shown in FIG. 12C, an oxide film 129 and nitride film are formed on the surface of the first spacer 126 and then the nitride film is selectively removed by RIE to form a second spacer 130 of nitride film on the side surface of the first spacer 126.

Figure 12D:
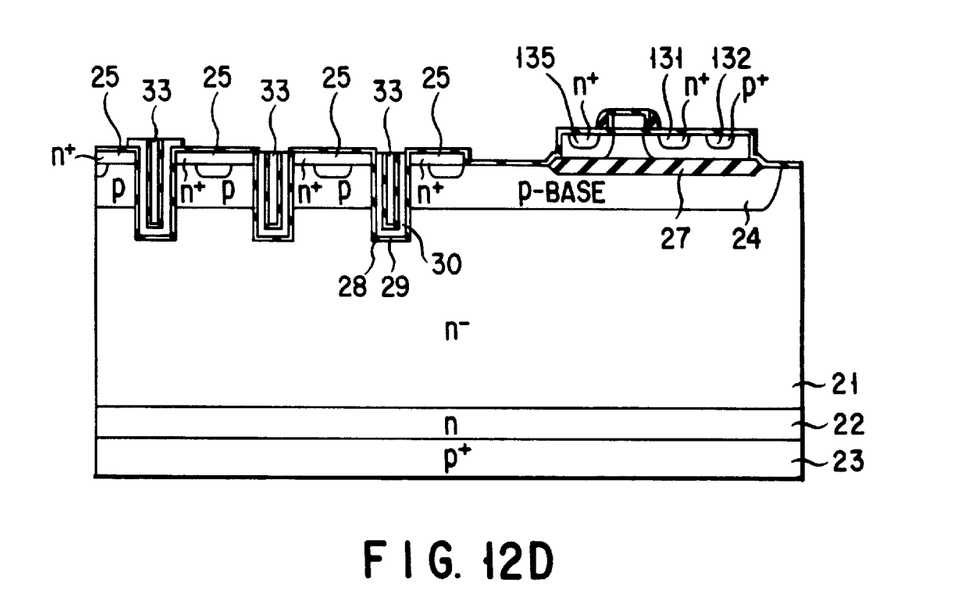

Next, as shown in FIG. 12D, a mask (not shown) having openings used for forming the n$^+$-type collector contact region 135, n$^+$-type emitter contact region 131 in the bipolar transistor region is formed, and phosphor, arsenic or the like is ion-implanted to form the n$^+$-type collector contact region 135 and n$^+$-type emitter contact region 131. The p$^+$-type base contact region 132 is formed in the same manner.

After this, an inter-level insulating film 41 is formed and a collector electrode 52, emitter electrode 50 and base electrode 51 are formed to complete the high breakdown voltage semiconductor device of FIG. 11.

In the structure of the fifth embodiment, the same effect as in the first embodiment can be attained. In addition, since the width of the p-type base layer can be defined in a self-alignment manner by use of the first and second spacers 126 and 130 in the lateral bipolar transistor, the base thickness can be adjusted with high precision and a bipolar transistor with excellent element characteristic can be realized.

(Sixth Embodiment)

Figure 13:
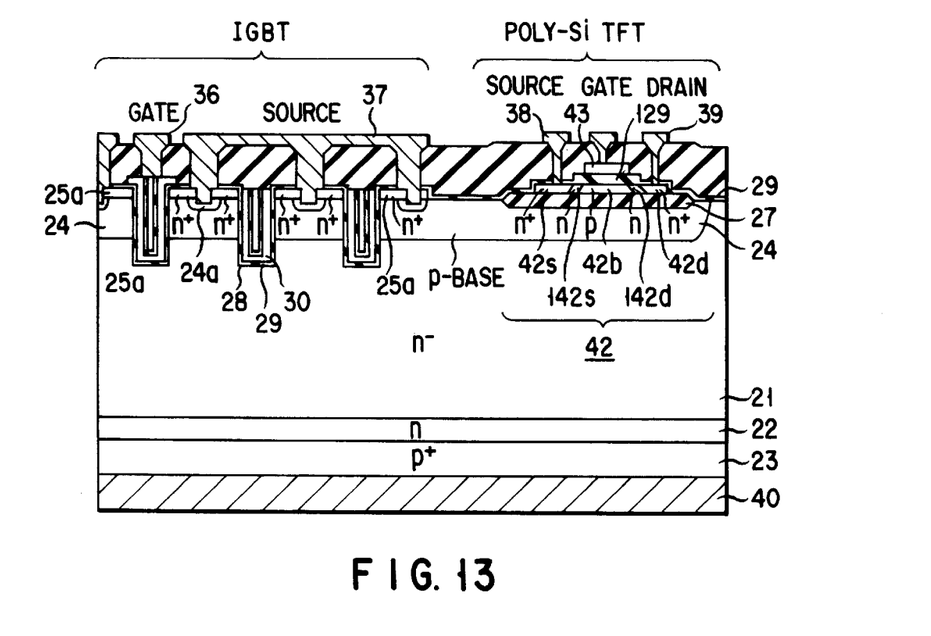
FIG. 13 is a cross sectional view showing the structure of a high breakdown voltage semiconductor device according to a sixth embodiment of this invention.

FIG. 13 is a cross sectional view showing the structure of a high breakdown voltage semiconductor device of a sixth embodiment of this invention. This embodiment is a modification of the second embodiment, and n$^+$-type source layers 25a of polysilicon are selectively formed on the surface of a p-type base layer 24 in an IGBT region, and at the same time, an active region 42 having a p-type base region 42b held between n-type source regions 42s, 142s and n-type drain regions 42d, 142d is formed on a LOCOS oxide film 27 in a TFT region. The n-type regions 142s, 142d are so-called lightly doped drain (LDD) layers. Further, on the active region 42, a gate electrode 43 of polysilicon is selectively formed with a gate oxide film 29 disposed therebetween.

Figure 14A:
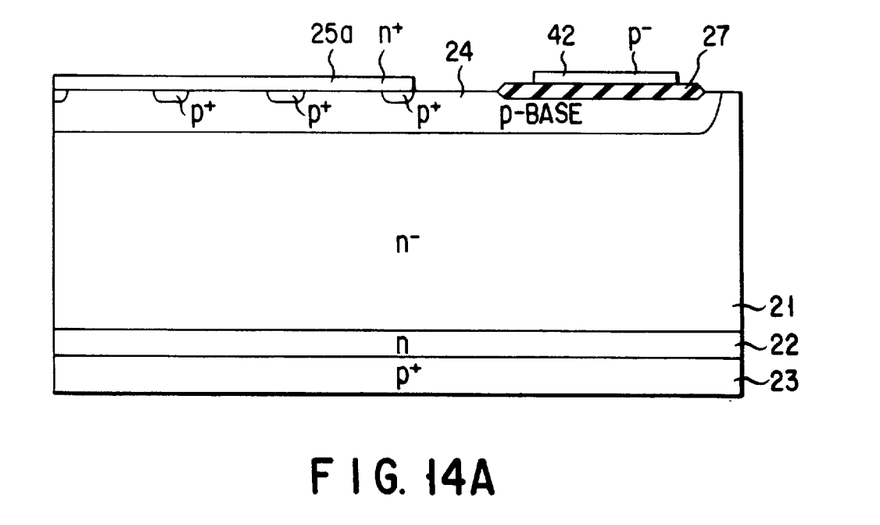
FIGS. 14A to 14D are cross sectional views sequentially showing the steps of a manufacturing method in the sixth embodiment.

With the above structure, after formation of the p-type base layer 24 by diffusion, amorphous silicon is deposited to form the n$^+$-type source regions 25a of the IGBT region and the active region 42 of the TFT region as shown in FIG. 14A. After formation of the active region 42, boron is ion-implanted to set the conductivity type of the active region 42 into a p-type.

Figure 14B:
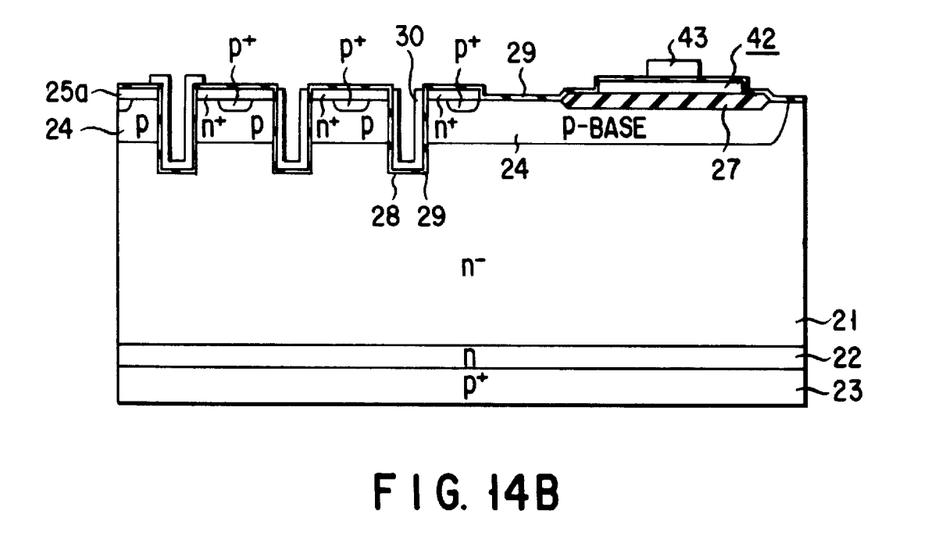

Next, as shown in FIG. 14B, after trenches 28 are formed and the oxide film 29 is formed by gate oxidation, polysilicon is deposited to form gate electrodes 30 and 43 of the IGBT and TFT, respectively.

Figure 14C:
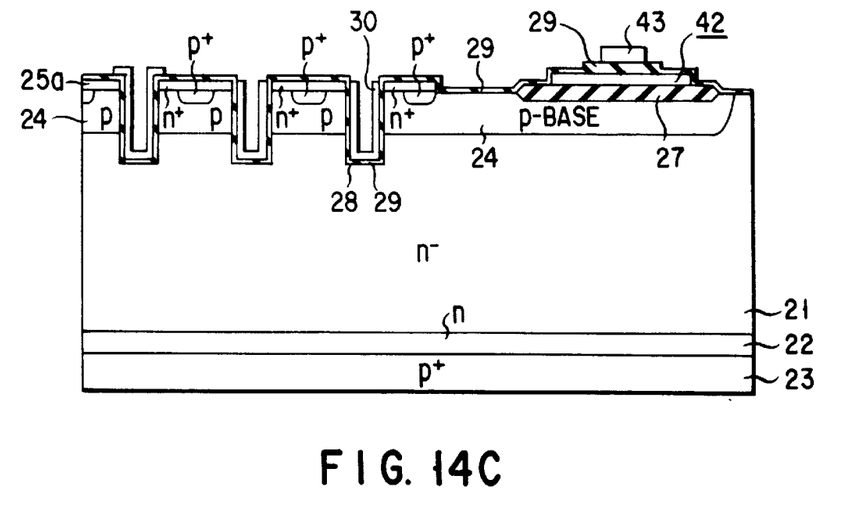

Next, as shown in FIG. 14C, a mask (not shown) larger than the gate electrode is formed on the gate electrode 43 and part of the gate insulating film 29 which lies on the active region 42 and is not covered with the mask is removed by wet etching. Then, an insulating film 129 thinner than the gate insulating film 29 is formed on an area from which part of the gate insulating film 29 was removed.

Figure 14D:
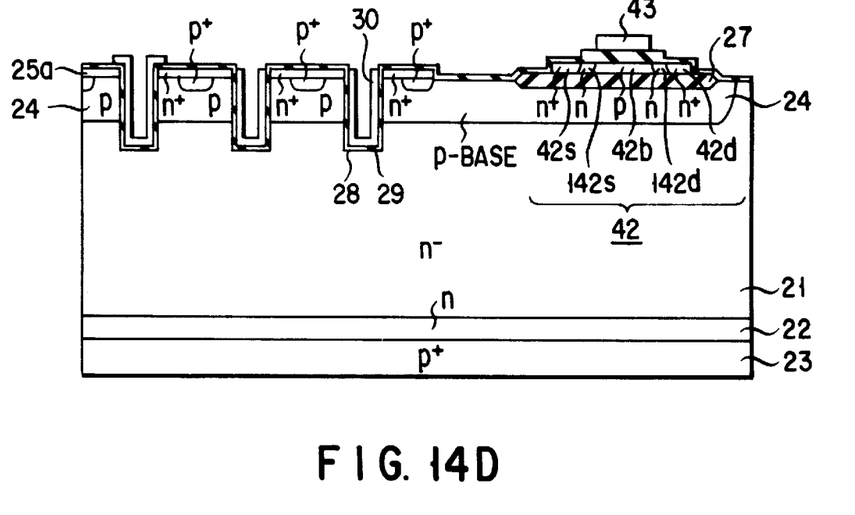

Next, arsenic or phosphorus ions are ion-implanted into the active region 42 with the gate electrode 43 used as a mask. As a result, as shown in FIG. 14D, n-type LDD layers 142s, 142d are formed under the relatively thick gate insulating film 29 and n$^+$-type source region 42s, n$^+$-type drain region 42d are formed under the relatively thin insulating film 129. A difference in the impurity concentration between the LDD regions and the source/drain regions is caused by a difference in the thickness of the insulating films.

The process after this is effected in the same manner as in the second embodiment to complete the high breakdown voltage semiconductor device of FIG. 13.

In the structure of the sixth embodiment, the same effect as in the first embodiment can be attained. In addition, the n-type LDD layers 142s, 142d and the n-type source layer 42s and n-type drain layer 42d can be simultaneously formed by one ion-implantation process by use of the relatively thick gate insulating film 29 for attaining the high breakdown voltage and the relatively thin insulating film 129 functioning as a protection film at the time of ion-implantation. Further, since the LDD layers are formed, deterioration in the mutual conductance and a variation with time of the threshold voltage by hot carriers can be prevented.

(Other Embodiment)

In the above embodiments, the first conductivity type is set to n and the second conductivity type is set to p, but this invention is not limited to this case, and the same effect can be attained by exchanging the n and p.

Further, the above embodiments are explained in a case wherein the second semiconductor element is formed of polysilicon, but the same effect can be attained even if the second semiconductor element is formed of single crystal silicon.

Further, the above embodiments are explained in a case wherein the first semiconductor element is formed as an IGBT, but this invention is not limited to this case and the same effect can be attained even if the first semiconductor element is formed as an IEGT (Injection Enhancement Gate Bipolar Transistor).

Further, the same effect can be obtained when the $p^+$-type drain layer 23 is exchanged by an $n^+$-type drain layer, thereby forming a vertical MOSFET. Moreover, the drain layer 23 and the drain electrode 40 of an IGBT or an MOSFET can be formed on the upper surface of the base layer 21, thereby forming a lateral IGBT or MOSFET.

As described above, according to this invention, a high breakdown voltage semiconductor device in which a first semiconductor element such as an IGBT of trench structure and a second semiconductor element formed of, for example, a bipolar transistor or TFT as a control circuit therefor can be easily integrally formed can be provided.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high breakdown voltage semiconductor device comprising:
    a first semiconductor element; and
    a second semiconductor element, wherein
        said first semiconductor element includes:
            a base layer of a first conductivity type with high resistance having a first main surface and a second main surface;
            a base layer of a second conductivity type formed on the first main surface of said base layer of the first conductivity type;
            a source layer of the first conductivity type formed in a surface area of said base layer of the second conductivity type;
            a drain layer of the second conductivity type formed on the second main surface of said base layer of the first conductivity type;
            a gate electrode buried and formed in a trench which penetrates said source layer of the first conductivity type and said base layer of the second conductivity type with a first insulating film disposed therebetween;
            a source electrode formed in contact with said source layer of the first conductivity type and said base layer of the second conductivity type; and
            a drain electrode formed in contact with said drain layer; and
        said second semiconductor element includes:
            a base region of the second conductivity type insulatively formed on said base layer of the second conductivity type;
            a gate layer formed on said base region of the second conductivity type with a second insulating film disposed therebetween; and
            a source region and a drain region of the first conductivity type insulatively formed on the surface of said base layer of the second conductivity type to hold said base region of the second conductivity type therebetween,
        wherein said source layer of the first conductivity type has a same thickness as said source region of the first conductivity type, said drain region of the first conductivity type, and said base region of the second conductivity type, and
        said gate electrode includes a portion having a same impurity concentration as said gate layer.

2. A high breakdown voltage semiconductor device according to claim 1, further comprising a buffer layer of the first conductivity type formed between said base layer of the first conductivity type and said drain layer.

3. A high breakdown voltage semiconductor device according to claim 1, wherein said gate electrode includes a first gate electrode formed in and along the trench with said first insulating film disposed therebetween and a second gate electrode formed on said first gate electrode with a third insulating film disposed therebetween to fill the trench, and said first gate electrode has the same impurity concentration as said gate layer.

4. A high breakdown voltage semiconductor device according to claim 3, wherein said gate layer and said first gate electrode are formed by deposition of polysilicon.

5. A high breakdown voltage semiconductor device according to claim 1, wherein said source layer is formed by deposition of amorphous silicon.

6. A high breakdown voltage semiconductor device according to claim 1, wherein said source region, said drain region and said base region are formed by deposition of amorphous silicon.

* * * * *